(12) United States Patent
Hudgens et al.

(10) Patent No.: US 10,943,805 B2
(45) Date of Patent: Mar. 9, 2021

(54) MULTI-BLADE ROBOT APPARATUS, ELECTRONIC DEVICE MANUFACTURING APPARATUS, AND METHODS ADAPTED TO TRANSPORT MULTIPLE SUBSTRATES IN ELECTRONIC DEVICE MANUFACTURING

(71) Applicant: Applied Materials, Inc., Santa Clara, CA (US)

(72) Inventors: Jeffrey C. Hudgens, San Francisco, CA (US); Michael R. Rice, Pleasanton, CA (US); Karuppasamy Muthukamatchi, Madurai (IN); Nir Merry, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 135 days.

(21) Appl. No.: 15/983,834

(22) Filed: May 18, 2018

(65) Prior Publication Data

US 2019/0355603 A1 Nov. 21, 2019

(51) Int. Cl.
*H01L 21/677* (2006.01)
*H01L 21/687* (2006.01)
*H01L 21/67* (2006.01)

(52) U.S. Cl.
CPC .. *H01L 21/67742* (2013.01); *H01L 21/67167* (2013.01); *H01L 21/68707* (2013.01)

(58) Field of Classification Search
CPC ......... H01L 21/67742; H01L 21/67167; H01L 21/68707; H01L 21/67748; H01L 21/68771; H01L 21/67739; H01L 21/67754; B25J 9/042; B25J 9/104; B25J 9/043; B25J 9/044; B25J 9/006; B25J 9/106; B25J 9/146; B25J 15/0052
See application file for complete search history.

(56) References Cited

U.S. PATENT DOCUMENTS

| | | | |
|---|---|---|---|
| 5,447,409 A | 9/1995 | Grunes et al. | |
| 5,590,996 A | 1/1997 | Thompson et al. | |
| 5,647,724 A | 7/1997 | Davis, Jr. et al. | |

(Continued)

OTHER PUBLICATIONS

Paul Z. Wirth, U.S. Appl. No. 15/708,806 (25481), titled: "Dual-Blade Robot Including Vertically Offset Horizontally Overlapping Frog-Leg Linkages and Systems and Methods Including Same," filed Sep. 19, 2017.

(Continued)

*Primary Examiner* — Glenn F Myers
(74) *Attorney, Agent, or Firm* — Lowenstein Sandler LLP

(57) ABSTRACT

Electronic device manufacturing apparatus and robot apparatus are described. The apparatus are configured to efficiently pick and place substrates wherein the robot apparatus includes an upper arm and three blades B1, B2, B3 that are independently rotatable. The three blades are configured to service a first dual load lock and second dual load lock wherein each dual load lock includes a different pitch. In some embodiments, a first pitch P1 is smaller than a second pitch P2. Blades B2 and B3 (or optionally blades B1 and B2) can service the first dual load lock with Pitch P1 and blades B1 and B3 can service the second dual load lock including the second pitch P2. Methods of operating the electronic device manufacturing apparatus and the robot apparatus are provided, as are numerous other aspects.

21 Claims, 9 Drawing Sheets

(56) References Cited

U.S. PATENT DOCUMENTS

| | | | |
|---|---|---|---|
| 5,746,565 A | 5/1998 | Tepolt | |
| 5,789,878 A | 8/1998 | Kroeker et al. | |
| 6,048,162 A | 4/2000 | Moslehi | |
| 6,056,504 A | 5/2000 | Hudgens et al. | |
| 6,132,165 A | 10/2000 | Carducci | |
| 6,155,131 A | 12/2000 | Suwa et al. | |
| 6,669,434 B2 | 12/2003 | Namba et al. | |
| 6,722,834 B1 | 4/2004 | Tepman | |
| 6,749,391 B2 | 6/2004 | Woodruff et al. | |
| 7,136,147 B2 | 11/2006 | Kuit | |
| 7,688,017 B2 | 3/2010 | Hudgens | |
| 7,927,062 B2 | 4/2011 | Rice et al. | |
| 8,016,542 B2 | 9/2011 | Cox et al. | |
| 8,061,232 B2 | 11/2011 | Kroetz et al. | |
| 8,264,187 B2 | 9/2012 | Laceky et al. | |
| 8,692,500 B2 | 4/2014 | Laceky et al. | |
| 8,777,547 B2 | 7/2014 | Kremerman et al. | |
| 8,784,033 B2 | 7/2014 | Kremerman et al. | |
| 9,076,829 B2 * | 7/2015 | Brodine | H01L 21/67742 |
| 9,761,478 B2 | 9/2017 | Caveney et al. | |
| 2003/0011338 A1 * | 1/2003 | Gilchrist | B25J 9/042 |
| | | | 318/568.21 |
| 2006/0130751 A1 | 6/2006 | Volfovski et al. | |
| 2008/0008569 A1 * | 1/2008 | Seol | H01L 21/67742 |
| | | | 414/287 |
| 2008/0260500 A1 * | 10/2008 | Meulen | B65G 25/02 |
| | | | 414/217 |
| 2011/0076117 A1 * | 3/2011 | Iizuka | H01L 21/6719 |
| | | | 414/217 |
| 2013/0115028 A1 | 5/2013 | Kremerman et al. | |
| 2013/0149076 A1 | 6/2013 | Cox et al. | |
| 2013/0272823 A1 | 10/2013 | Hudgens et al. | |
| 2014/0010625 A1 | 1/2014 | Hudgens et al. | |
| 2014/0107825 A1 * | 4/2014 | Kubodera | G05B 19/4189 |
| | | | 700/112 |
| 2014/0150592 A1 | 6/2014 | Kremerman | |
| 2014/0154038 A1 | 6/2014 | Hudgens et al. | |
| 2014/0271055 A1 | 9/2014 | Weaver et al. | |
| 2014/0286736 A1 | 9/2014 | Kremerman et al. | |
| 2014/0286741 A1 | 9/2014 | Kremerman et al. | |
| 2015/0013910 A1 | 1/2015 | Krupyshev et al. | |
| 2015/0190933 A1 * | 7/2015 | Kremerman | B25J 17/02 |
| | | | 414/806 |
| 2015/0217446 A1 | 8/2015 | Kremerman | |
| 2015/0217466 A1 | 8/2015 | Leicht et al. | |
| 2016/0082599 A1 | 3/2016 | Wakabayashi | |
| 2016/0107317 A1 | 4/2016 | Hashimoto et al. | |
| 2016/0263742 A1 | 9/2016 | Hosek et al. | |
| 2016/0284578 A1 | 9/2016 | Weaver et al. | |
| 2016/0303742 A1 | 10/2016 | Embertson et al. | |
| 2016/0329234 A1 | 11/2016 | Krupyshev et al. | |
| 2017/0040203 A1 | 2/2017 | Caveney et al. | |
| 2017/0117171 A1 | 4/2017 | Wirth | |
| 2017/0368680 A1 | 12/2017 | Muthukamatchi et al. | |
| 2019/0088530 A1 | 3/2019 | Wirth | |

OTHER PUBLICATIONS

PCT International Search Report and Written Opinion for International Application No. PCT/US2019/032980, dated Sep. 18, 2019, 13 pages.

* cited by examiner

US 10,943,805 B2

MULTI-BLADE ROBOT APPARATUS, ELECTRONIC DEVICE MANUFACTURING APPARATUS, AND METHODS ADAPTED TO TRANSPORT MULTIPLE SUBSTRATES IN ELECTRONIC DEVICE MANUFACTURING

FIELD

The present disclosure relates to electronic device manufacturing, and more specifically to apparatus and methods adapted to transport multiple substrates within an electronic device manufacturing apparatus.

BACKGROUND

Conventional electronic device manufacturing apparatus can include multiple chambers, such as process chambers and load lock chambers. Such chambers can be included in a cluster tool where a plurality of such process and load lock chambers can be distributed about a transfer chamber. Such electronic device manufacturing apparatus can employ a robot apparatus in the transfer chamber that is configured to transport substrates between the various load lock and process chambers. In some embodiments, the transfer chamber, process chambers, and load lock chambers may operate under a vacuum at certain times. However, in certain configurations of prior art electronic device manufacturing apparatus, transport of substrates between the various chambers with the robot apparatus can be somewhat inefficient.

Accordingly, improved robot apparatus, electronic device manufacturing apparatus, and methods for transporting substrates having improved efficiency are sought.

SUMMARY

In a first aspect a robot apparatus is provided. The robot apparatus includes an upper arm including an inboard end and an outboard end, the inboard end configured to rotate about a shoulder axis, a first blade configured for independent rotation relative to the upper arm about an outboard axis, the first blade including a first end effector, a second blade configured for independent rotation relative to the upper arm about the outboard axis, the second blade including a second end effector, and a third blade configured for independent rotation relative to the upper arm about the outboard axis, the third blade including a third end effector.

According to another aspect an electronic device processing system is provided. The electronic device processing apparatus includes a mainframe including a transfer chamber and at least two process chambers, a first dual load lock coupled to the mainframe and including a first vertical pitch between an upper load lock support and a lower load lock support, a second dual load lock coupled to the mainframe and including a second vertical pitch between an upper load lock support and a lower load lock support of the second dual load lock, wherein the first vertical pitch is less than the second vertical pitch, and a robot apparatus configured to transport substrates to the first dual load lock and the second dual load lock and the at least two process chambers, the robot apparatus including: an upper arm including an inboard end and an outboard end, the inboard end configured to rotate about a shoulder axis, a first blade configured for independent rotation relative to the upper arm about an outboard axis, the first blade including a first end effector, a second blade configured for independent rotation relative to the upper arm about the outboard axis, the second blade including a second end effector, and a third blade configured for independent rotation relative to the upper arm about the outboard axis, the third blade including a third end effector, wherein a vertical spacing between the first end effector and the second end effector equals the first vertical pitch and a spacing between the first end effector the third end effector is equal to the second vertical pitch.

In another aspect, a method of transporting multiple substrates within an electronic device manufacturing apparatus is provided. The method comprises providing a mainframe including a transfer chamber and at least two process chambers; providing a first dual load lock coupled to the mainframe and including a first vertical pitch between an upper load lock support and a lower load lock support of the dual first load lock, and a second dual load lock coupled to the mainframe and including a second vertical pitch between an upper load lock support and a lower load lock support of the second dual load lock, wherein the first vertical pitch is less than the second vertical pitch; providing a robot apparatus configured to transport substrates to the first dual load lock and the second dual load lock and the at least two process chambers, the robot apparatus including: an upper arm including an inboard end and an outboard end, the inboard end configured to rotate about a shoulder axis, a first blade configured for independent rotation relative to the upper arm about an outboard axis, the first blade including a first end effector, a second blade configured for independent rotation relative to the upper arm about the outboard axis, the second blade including a second end effector, and a third blade configured for independent rotation relative to the upper arm about the outboard axis, the third blade including a third end effector; servicing the first dual load lock with the second blade and the third blade (or the first blade and the second blade); and servicing the second dual load lock with the first blade and the third blade.

Numerous other features are provided in accordance with these and other aspects of the disclosure. Other features and aspects of the present disclosure will become more fully apparent from the following detailed description, the claims, and the accompanying drawings.

DETAILED DESCRIPTION

Figure 1A:
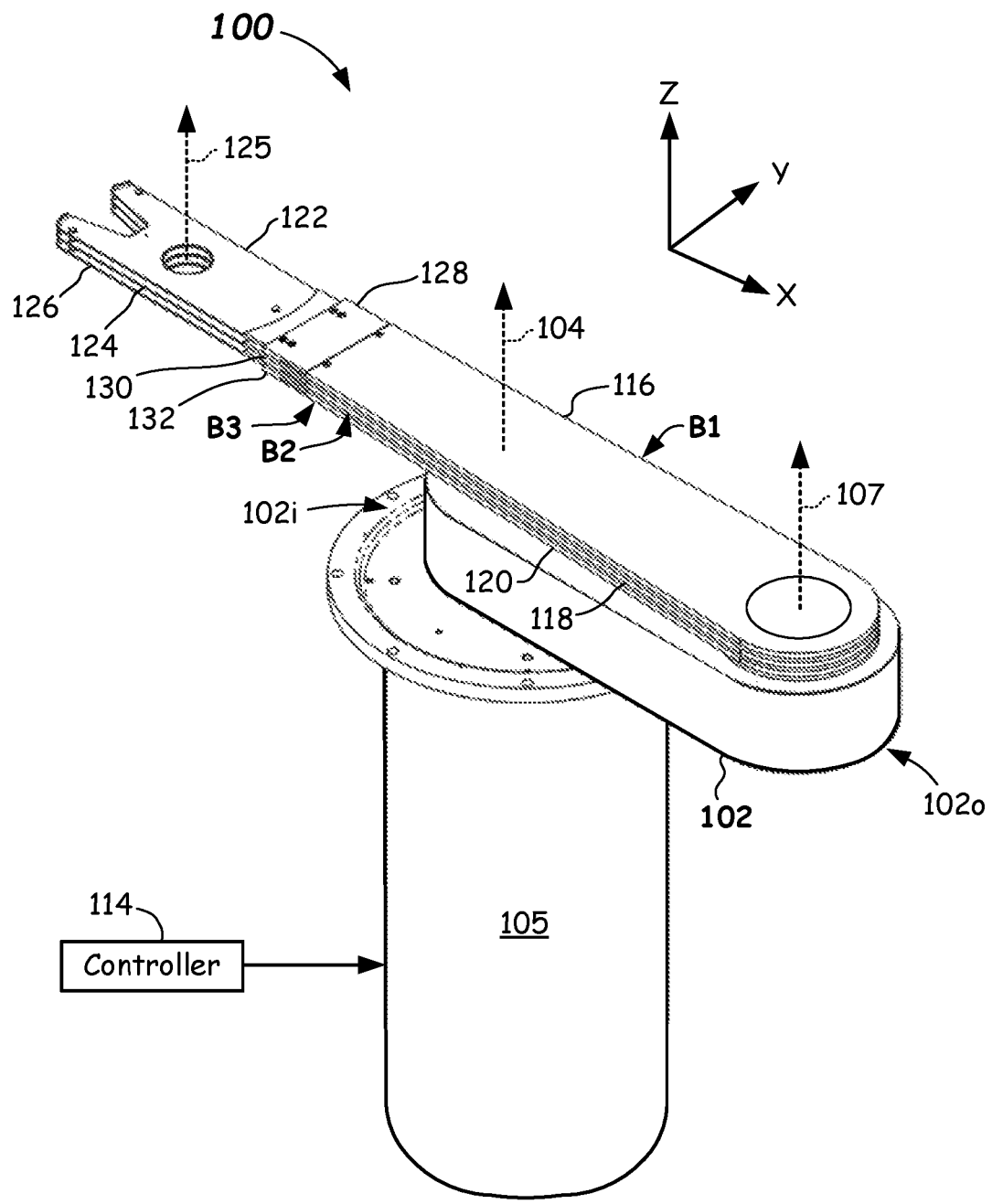
FIG. 1A illustrates a perspective view of a robot apparatus including three independently-controllable blades according to one or more embodiments.

Precision and efficiency of transport of substrates between various locations in electronic device transport systems is sought. However, in some systems, transfer between the various chambers may become a bottleneck limiting efficiency. Furthermore, simplified robot construction is also sought, wherein the number of robotic arms can be minimized.

In order to improve efficiency, many robot apparatus for electronic device manufacturing apparatus include dual end effectors, sometimes referred to as including "dual blades," that may be attached at an end arm of a series of interconnected arms of a robot apparatus and may be adapted to transport multiple substrates resting upon the end effectors to and from process chambers and/or load lock chambers of the electronic device manufacturing apparatus. Conventional dual-blade robot apparatus may only exchange one-for-one. That is, they can retrieve one substrate from a chamber and replace it with one substrate. Accordingly, robot apparatus and electronic device apparatus that include improved handoff efficiencies would constitute a substantial advancement in the electronic device manufacturing art.

Therefore, embodiments of the present disclosure, in one aspect, provide a robot apparatus having a compact configuration and including three blades (B1, B2, B3), wherein each blade is independently controllable. A blade as used herein means a combination of a wrist member and at least one end effector, either as separate components or as one integral component. Robot apparatus embodiments described herein include an upper arm, and multiple blades rotatable about an outboard end of the upper arm. In particular, the wrist members can be rotatable about an outboard end of the upper arm. Thus, a refined robot construction having few arms is provided. The inboard end of the upper arm is rotatable about a shoulder axis. Each of the three blades (B1, B2, and B3) may include attached end effectors, i.e., combinations of a wrist member and an end effector.

The independent control of the respective wrist members and thus blades (B1, B2, and B3) is provided by a drive assembly. The drive assembly includes respective drive shafts coupled or interconnected to drive the upper arm and the first blade B1, second blade B2, and third blade B3, in rotation. Accordingly, all of the moving components (e.g., upper arm and first, second, and third blades) may be driven from a common drive location. This highly functional configuration enables not only a simplified robot construction, but may also allow enhanced efficiency, as will be apparent from the following.

In another aspect, an electronic device manufacturing apparatus is provided that includes a robot apparatus having three independently-controllable blades (B1, B2, B3) including end effectors that may be used for transporting substrates between process chambers and load lock chambers. The electronic device manufacturing apparatus includes a robot apparatus including the upper arm and three coupled independently-controllable blades. The electronic device manufacturing apparatus further includes a first dual load lock and a second dual load lock. The first and second dual load locks have different vertical pitches between respective upper and lower substrates supports provided therein. In one embodiment, one dual load lock includes a vertical pitch of 1 P whereas another dual load lock includes a vertical pitch of greater than 1 P (e.g., 1 P×2=2 P). The larger-pitch dual load lock can be serviced by blade B1 (upper blade) and blade B3 (lower blade), whereas the smaller pitch dual load lock can be serviced by blade B2 (middle blade) and blade B3 (lower blade). In some embodiments, the robot apparatus can include z-axis capability.

Further details and example embodiments illustrating various aspects of the robot apparatus and electronic device manufacturing apparatus are described with reference to FIGS. 1A-6 herein.

Referring now to FIGS. 1A-1D, an example embodiment of a robot apparatus 100 configured for use in an electronic device manufacturing apparatus 400 (FIG. 4) according to embodiments of the present disclosure is provided. The robot apparatus 100 is useful for, and may be configured and adapted to transfer substrates 115 between various process chambers 403, and/or to exchange substrates 415 at one or more load lock apparatus 409A, 409B, for example. In the depicted embodiment, two load lock apparatus 409A, 409B. However, the robot apparatus 100 could be used with only one load lock apparatus or more than two load lock apparatus.

The robot apparatus 100 has an upper arm 102 including an inboard end 102i and outboard end 102o. The inboard end 102i is configured to be rotatable about a shoulder axis 104 by an upper arm drive motor 106 (FIG. 1D) of a drive motor assembly 105. A drive assembly of driving and driven pulleys and transmission members is included within the upper arm 102 as will be apparent from the following.

The robot apparatus 100 shown includes three blades B1 (upper), B2 (middle), B3 (lower) coupled for rotation to the outboard end 102o of the upper arm 102 opposite from the inboard end 102i. Each of the blades B1, B2, B3 is independently rotatable about the outboard axis 107 through the commanded action of first drive motor 108, second drive motor 110, and third drive motor 112, respectively. Each of the first drive motor 108, second drive motor 110, and third drive motor 112 is commanded by a suitable control signal received from a controller 114. Controller 114 can be any suitable processor, memory, conditioning electronics and drivers capable of processing control instructions and carrying out motion of the upper arm 102 and blades B1, B2, B3.

Figure 1B:
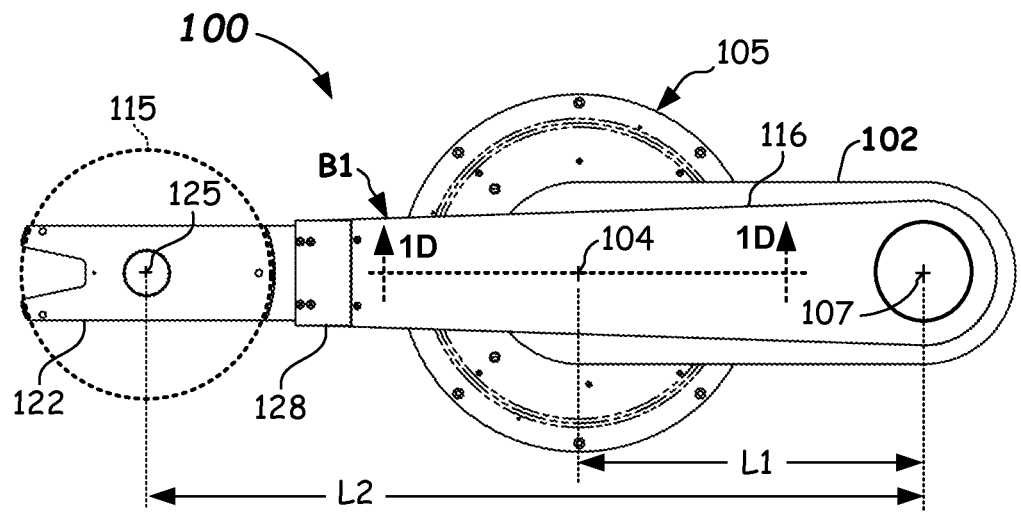
FIG. 1B illustrates a top plan view of a robot apparatus including three independently-controllable blades shown in a folded and zeroed orientation according to one or more embodiments.
Figure 1C:
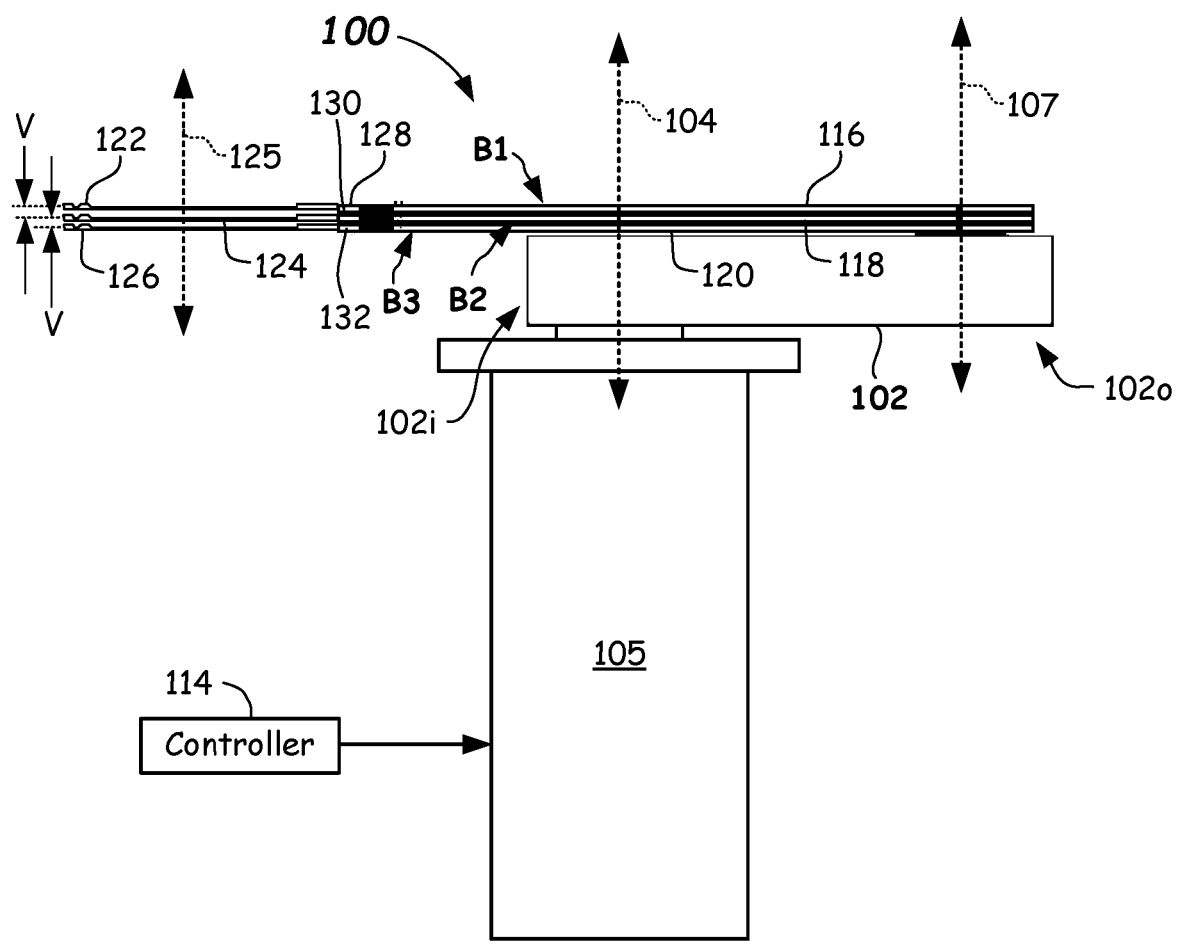
FIG. 1C illustrates a side plan view of a robot apparatus including three independently-controllable bladed shown in a folded and zeroed orientation according to one or more embodiments.

The upper arm 102 can have a center-to-center length of L1, as shown in FIG. 1B, wherein the centers of the length L1 are the shoulder axis 104 and the outboard axis 107. Each of the blades B1, B2, B3 in the depicted embodiment can be made up of a wrist member, namely first wrist member 116, second wrist member 118, and third wrist member 120. Further, each of the blades B1, B2, B3 in the depicted embodiment includes an end effector, namely first end effector 122, second end effector 124, and third end effector 126, that are each configured and adapted to support and transport a substrate 115 thereon.

The blades B1, B2, B3 each have a center-to-center length L2, as shown in FIG. 1B, wherein the centers of the blades B1, B2, and B3 are the outboard axis 104 and a nominal center 125 of a substrate support location that is configured to support substrates 115 on each of end effectors 122, 124, 126. The nominal center 125 is where the substrate 115 will rest on each of the first, second, and third end effectors 122, 124, 126 when nominally positioned thereon. Restraining features restrain location of the substrates on the end effectors 122, 124, 126 within limits. In the depicted embodiment, the first, second, and third wrist members 116, 118, 120 and the end effectors 122, 124, 126 are separate interconnected members. However, it should be understood that each wrist member and end effector may be integrally formed in some embodiments and constitute one unitary component. In the depicted embodiment, each of the wrist members 116, 118, 120 may include an orientation adjuster 128, 130, 132 at the end thereof to allow for fine orientation adjustments (e.g., adjustments for droop and/or tilt) to each of the end effectors 122, 124, 126. The orientation adjusters 128, 130, 132 can use screws and/or shims to accomplish end effector attitude adjustments.

Thus, it should be apparent that the first blade B1 is configured for independent rotation relative to the upper arm 102 about the outboard axis 107, and wherein the first blade B1 includes the first end effector 122. Likewise, the second blade B2 is configured for independent rotation relative to the upper arm 104 about the outboard axis 107, and wherein the second blade B2 includes a second end effector 124. Moreover, the third blade B3 is configured for independent rotation relative to the upper arm 102 about the outboard axis 107, and wherein the third blade B3 includes the third end effector 126. The rotation is provided by the drive motor assembly 105 and the drive assembly described below.

As can be seen in FIGS. 1A and 1B, the first end effector 124, second end effector 126, and the third end effector 128 lie one above another when configured in a folded and zeroed configuration, as shown. This folded and zeroed configuration is the neutral configuration and the blades B1, B2, B3, can be rotated approximately +/−170 degrees from this orientation, for example.

As can be seen in FIG. 1B, the robot apparatus 100 includes blades B1, B2, B3 that each have a length L2 that is longer than the center-to-center length L1 of the upper arm 102. In particular, the respective center-to-center lengths L1, L2 are related by L2≥L1. In some embodiments, L2>2L1. In other embodiments, the respective center-to center lengths can be related by L1≤L2≤2×L1, or even 1.5×L1≤L2≤2×L1. By way of example, and not to be considered limiting, L1 can be between about 450 mm and 600 mm and L2 can be between about 450 mm and 1,200 mm. In some embodiments, L1 can be between about 800 mm and 1,000 mm and L2 can be between about 450 mm and 1,200 mm. In some embodiments L2 could be less than L1.

Furthermore, a first vertical spacing between a first support location of the first end effector 122 and a second support location of the second end effector 124 can be the same as a second vertical spacing between the second support location of the second end effector 124 and a third support location of the third end effector 126, i.e., the blades B1, B2, B3 can be equally vertically spaced. The vertical spacing V (FIG. 1C) between the support locations of the respective end effectors 122, 124, 126 can range from 7 mm to 25 mm, from 7 mm to 20 mm, or even between 9 mm and 18 mm, for example. Other vertical spacing values are possible.

Figure 1D:
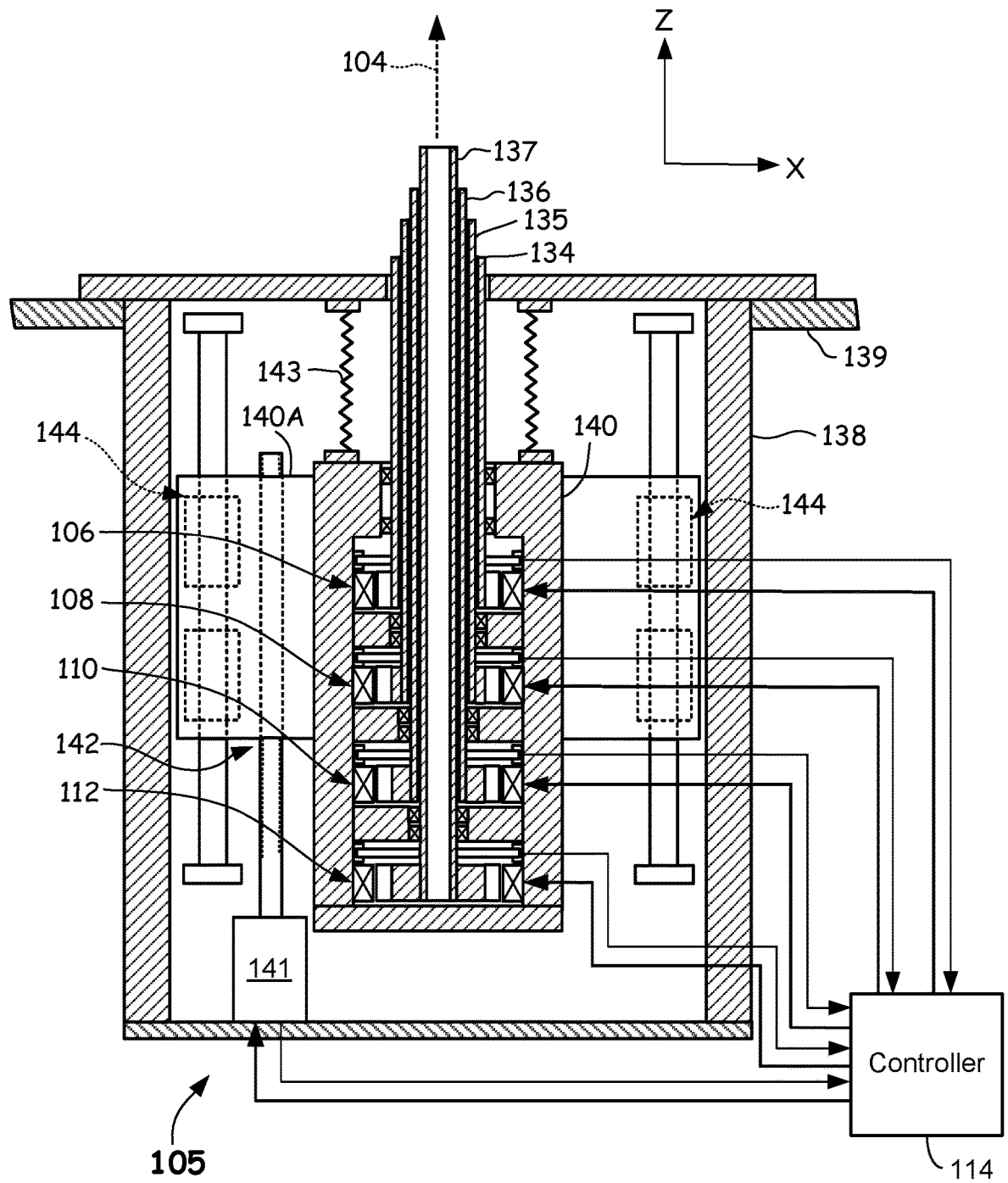
FIG. 1D illustrates a partially cross-sectioned side plan view showing a drive motor assembly of a robot apparatus according to one or more embodiments.

Now in more detail and referring to FIG. 1D, the drive motor assembly 105 is described. The connections to the respective upper arm 102 and driving pulleys are not shown in FIG. 1D for clarity. The drive motor assembly 105 includes an upper arm shaft 134 configured to be coupled to the upper arm drive motor 106 on a lower end and configured to couple to and drive the upper arm 102 on an upper end and cause independent rotation thereof in an X-Y plane. The upper arm shaft 134 is coupled to the inboard end 102$i$ of the upper arm 102 by any suitable means, such as fasteners or the like.

The drive motor assembly 105 further includes a first blade shaft 135 coupled to the first drive motor 108 on a lower end and configured to interconnect to and drive the first blade B1 and cause independent rotation thereof in an X-Y plane. The drive motor assembly 105 further includes a second blade shaft 136 coupled to the second drive motor 110 on a lower end and configured to interconnect to and drive the second blade B2 and cause independent rotation thereof in an X-Y plane. Finally, the drive motor assembly 105 includes a third blade shaft 137 coupled to the third drive motor 112 on a lower end and configured to interconnect to and drive the third blade B3 and cause independent rotation thereof in an X-Y plane. The shafts 134, 135, 136, 137 may be supported for rotation by suitable rotation-accommodating members, such as bearings. Any suitable bearing may be used, such as sealed ball bearings.

Figure 4:
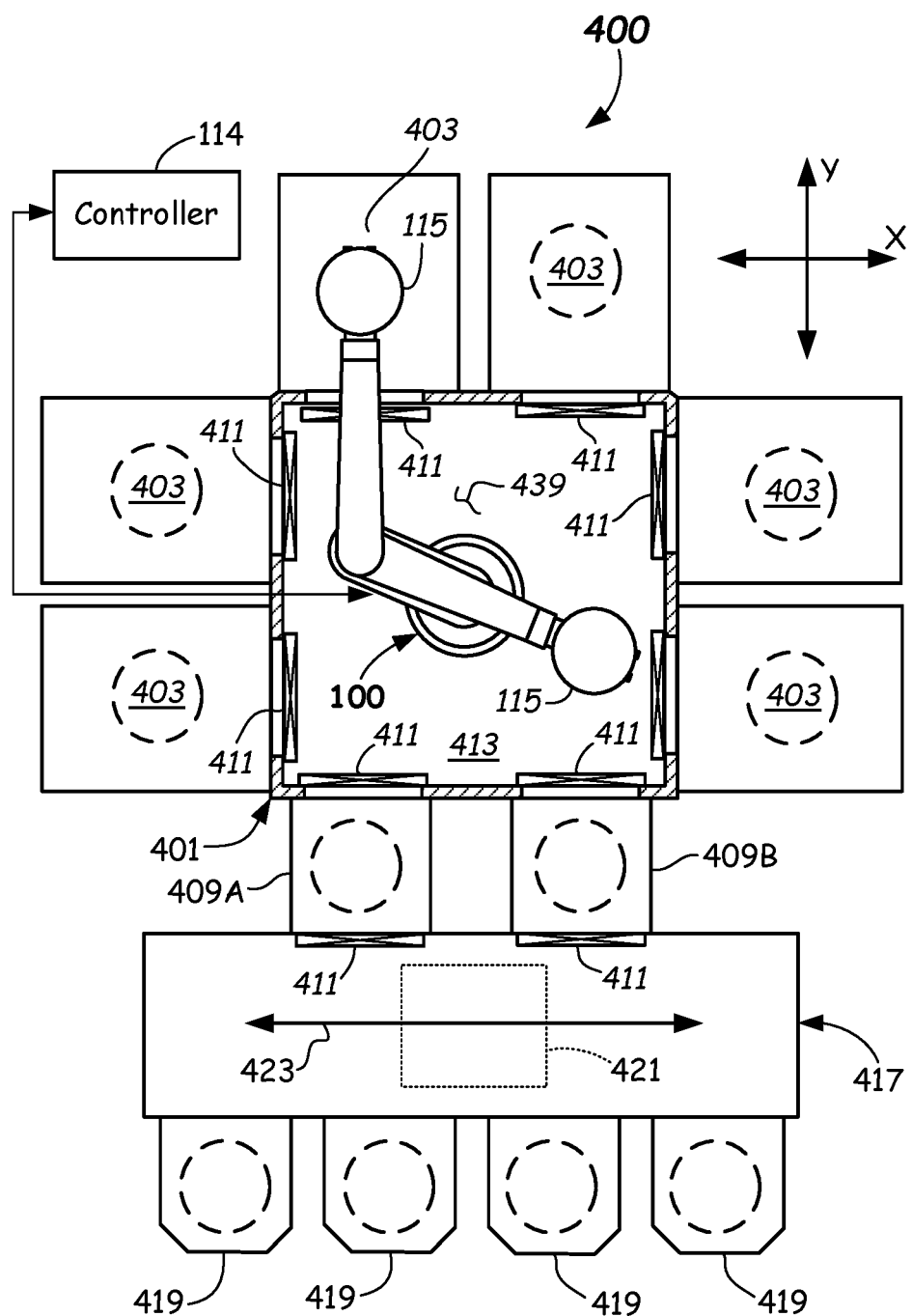
FIG. 4 is a top schematic view of a robot apparatus shown servicing a process chamber of an electronic device manufacturing apparatus according to one or more embodiments.

The drive motor assembly 105 may include an outer motor housing 138, which may be coupled to a floor 139 of a transfer chamber 413 as shown in FIG. 4, for example. An inner motor housing 140 of the drive motor assembly 105 can be fixed in regards to rotation relative to the outer motor housing 138, but can move in the Z direction to accomplish z-axis motion of the blades B1, B2, B3. Motion along the Z-axis can be accommodated by any suitable linear slide mechanism, such as rails and linear bearings shown, for example. It should be recognized that Z-axis capability may not be present in all embodiments, and is therefore optional.

In embodiments with Z-axis capability, FIG. 1D illustrates a vertical motor 141 and a vertical drive mechanism 142 that is configured and adapted to cause vertical motion (along the Z-axis) of the inner motor housing 140 relative to the outer motor housing 138 and thus vertical motion of the first, second, and third blades B1, B2, B3. The vertical drive mechanism 142 may comprise a worm drive, lead screw, ball screw, or rack and pinion mechanism that, when rotated by the vertical motor 141, causes the inner motor housing 140 to translate vertically along the plus or minus Z-axis and accomplishing raising or lowering of the blades B1, B2, B3. A vacuum barrier 143 (e.g., a sealed bellows or the like) may be used to accommodate the vertical motion and also act as a vacuum barrier in some embodiments. One or more translation-accommodating devices 144 (shown dotted), such as linear bearings, bushings, or other linear motion-restraining means may be used to restrain the motion of the inner motor housing 140 to vertical motion only along the Z-axis, i.e., along shoulder axis 104. In the depicted embodiment, a lead screw may engage a lead nut mounted to an appendage 140A of the inner motor housing 140. Vertical motor 141 can be a stepper motor or the like.

Vertical motor 141 may include feedback via a rotation or translation to provide vertical position feedback information to the controller 114 in some embodiments. Likewise, any suitable type of feedback device may be provided to determine a precise rotational position of the upper arm 102 and each of the blades B1, B2, B3. For example, encoders may be coupled to the upper arm shaft 134, first shaft 135, second shaft 136, and third shaft 137 and measure rotational position relative to the inner housing 140. The encoders may be rotary encoders and may be a magnetic type, optical type, or another type of rotary encoder.

The independent rotation of the upper arm 102 in the X-Y plane about the shoulder axis 104 may be provided by connection of the upper arm shaft 134 to the upper arm 102 by any suitable means, such as fasteners or other suitable means. Optionally, the upper arm shaft 134 may be made integral with the upper arm 102. The upper arm drive motor 106 may be a stepper motor, variable reluctance motor, permanent magnet electric motor, or the like. Other types of motors may be used. The rotation of the upper arm 102 may be independently controlled by suitable commands provided to the upper arm drive motor 106 from the controller 114. Controller 114 may also receive positional feedback information from the encoder via a wiring harness connected between the upper arm drive motor 106 and the controller 114. Rotation of the upper arm 102 may be up to about +/−360 degrees or more from the folded and zeroed orientation shown in FIG. 1B, for example.

Rotation of the first blade B1 in the X-Y plane about the outboard axis 107 may be provided by action of the first drive motor 108 rotating the first blade shaft 135. The first drive motor 108 may be the same as discussed above. The rotation of the first blade B1 may be independently controlled by suitable commands provided to the first drive motor 108 from the controller 114. Controller 114 may also receive positional feedback information from the encoder, a portion of which is coupled to the first blade shaft 135 via a wiring harness connected between the first drive motor 108 and the controller 114. Rotation of the first blade B1 may be up to about +/−170 degrees from the folded and zeroed orientation shown in FIG. 1B, for example.

Rotation of the second blade B2 in the X-Y plane about the outboard axis 107 may be provided by action of the second drive motor 110 rotating the second blade shaft 136. The second drive motor 110 may be the same as discussed above. The rotation of the second blade B2 may be independently controlled by suitable commands provided to the second drive motor 110 from the controller 114. Controller 114 may also receive positional feedback information from the encoder, a portion of which is coupled to the second blade shaft 136 via a wiring harness connected between the second drive motor 110 and the controller 114. Rotation of the second blade B2 may be up to about +/−170 degrees from the folded and zeroed orientation shown in FIG. 1B, for example.

Likewise, rotation of the third blade B3 in the X-Y plane about the outboard axis 107 may be provided by action of the third drive motor 112 rotating the third blade shaft 137. The third drive motor 112 may be the same as discussed above. The rotation of the third blade B3 may be independently controlled by suitable commands provided to the third drive motor 112 from the controller 114. Controller 114 may also receive positional feedback information from the encoder, a portion of which is coupled to the third blade shaft 137 via a wiring harness connected between the third drive motor 112 and the controller 114. Rotation of the third blade B3 may be up to about +/−170 degrees from the folded and zeroed orientation shown in FIG. 1B, for example.

Figure 2A:
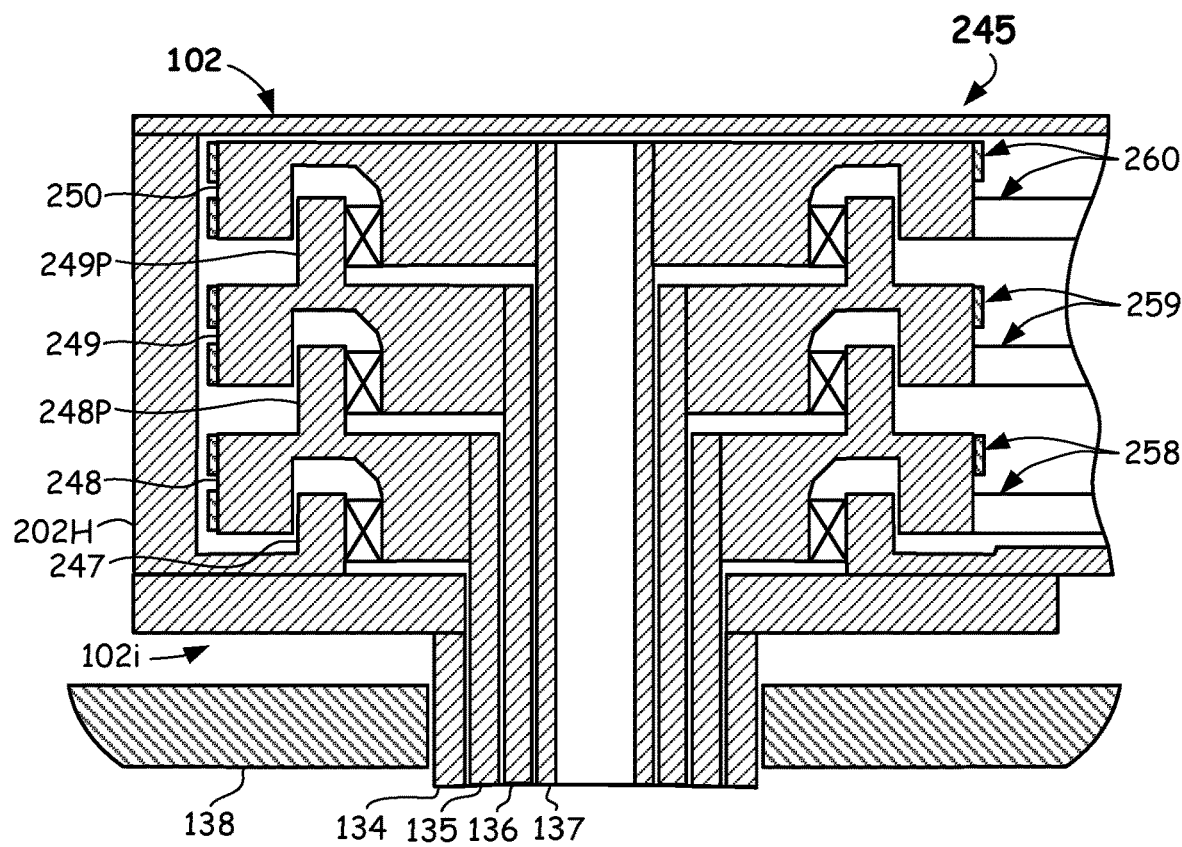
FIG. 2A illustrates a partial cross-sectional side view of an inboard end of a drive assembly of a robot apparatus according to one or more embodiments.
Figure 3A:
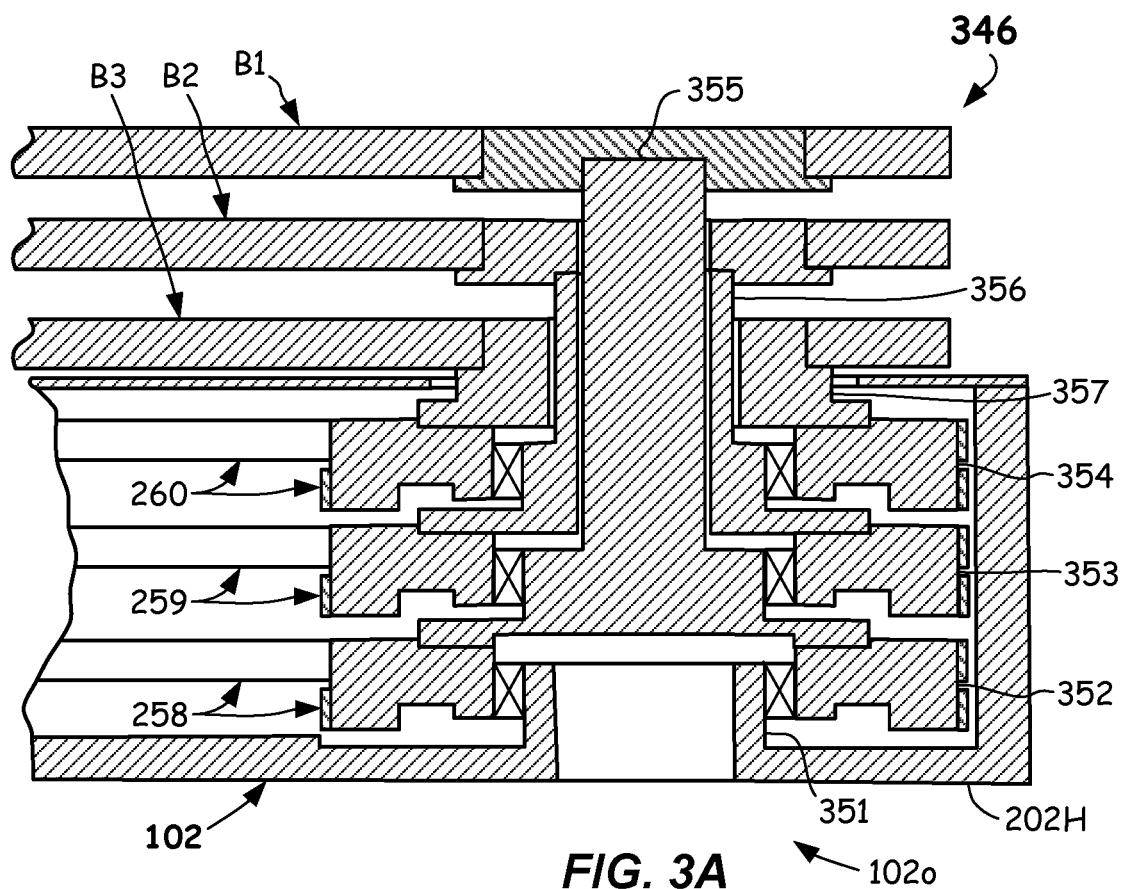
FIG. 3A illustrates a partial cross-sectional side view of an outboard end of a drive assembly of a robot apparatus according to one or more embodiments.

Now referring to FIGS. 2A and 3A, a first embodiment of a blade drive assembly including the inboard end drive assembly 245 (FIG. 2A) and an outboard end drive assembly 346 (FIG. 3B) is shown and described. The inboard end drive assembly 245 includes a first inboard pilot 247 that can extend upwardly (as shown) from a lower portion of an upper arm housing 202H, and a first driving pulley 248 mounted for rotation on the first pilot 247, such as by a suitable bearing or the like. All bearings in inboard end drive assembly 245 and outboard end drive assembly 346 are denoted by X in a box.

Inboard end drive assembly 245 further includes a second driving pulley 249 mounted for rotation on the first driving pulley 248, such as by a suitable bearing or the like coupled between the second driving pulley 249 and a pilot portion 248P of the first driving pulley 248. First driving pulley 248 and second driving pulley 249 can be co-axial as shown. Inboard end drive assembly 245 further includes a third driving pulley 250 mounted for rotation on the second driving pulley 249, such as by a suitable bearing or the like coupled between the third driving pulley 250 and a pilot portion 249P of the second driving pulley 249. Second driving pulley 249 and third driving pulley 250 can be co-axial as shown. Connections between the respective shafts 134-137 and the respective driving pulleys 248, 249, 250 can be by any suitable connection mechanism, such as bolts, screws, a clamping mechanism, or the like.

Referring now to FIG. 3A, the outboard end 102o of the blade drive assembly includes outboard end drive assembly 346. The outboard end drive assembly 346 includes a first outboard pilot 351 that may extend upwardly, as shown, from a bottom portion of the upper arm housing 202H, and a first driven pulley 352 mounted for rotation on the first outboard pilot 351, such as by a suitable bearing or the like. Outboard end drive assembly 346 further includes a second driven pulley 353 mounted for rotation on the first driven pulley 352, such as by bearings or the like. First driven pulley 352 and second driven pulley 353 can be co-axial as shown. Outboard end drive assembly 346 can further include a third driven pulley 354 mounted for rotation on the second driven pulley 353.

The mounting for rotation in each case may be by mounting the respective driven pulley to a respective shaft connected to a respective blade. For example, rotational connection may be via first outer shaft 355 connecting blade B1 to first driven pulley 352, second outer shaft 356 connecting blade B2 to second driven pulley 353, and third outer shaft 357 connecting blade B3 to third outboard driven pulley 354. Bolts, screws, or other fasteners (not shown) may be used to make the various connections.

Figure 2B:
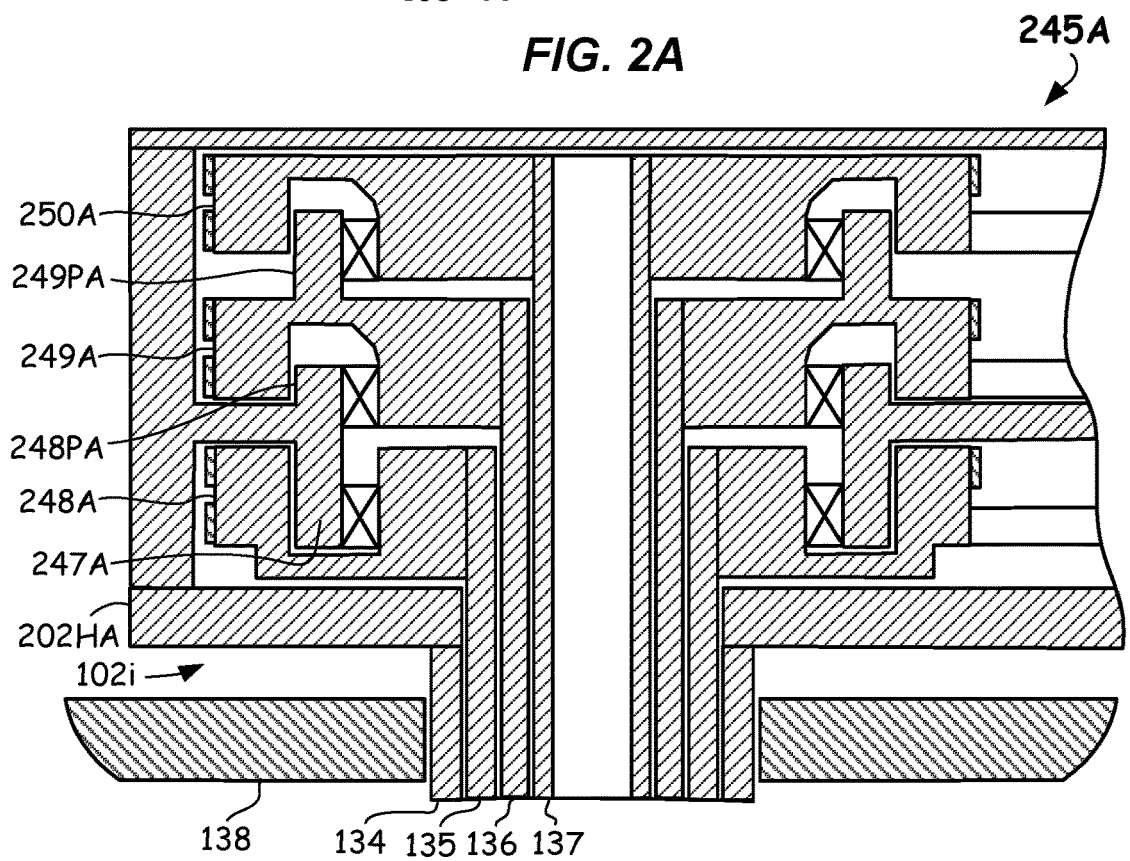
FIG. 2B illustrates a partial cross-sectional side view of an inboard end of an alternative drive assembly of a robot apparatus according to one or more embodiments.
Figure 3B:
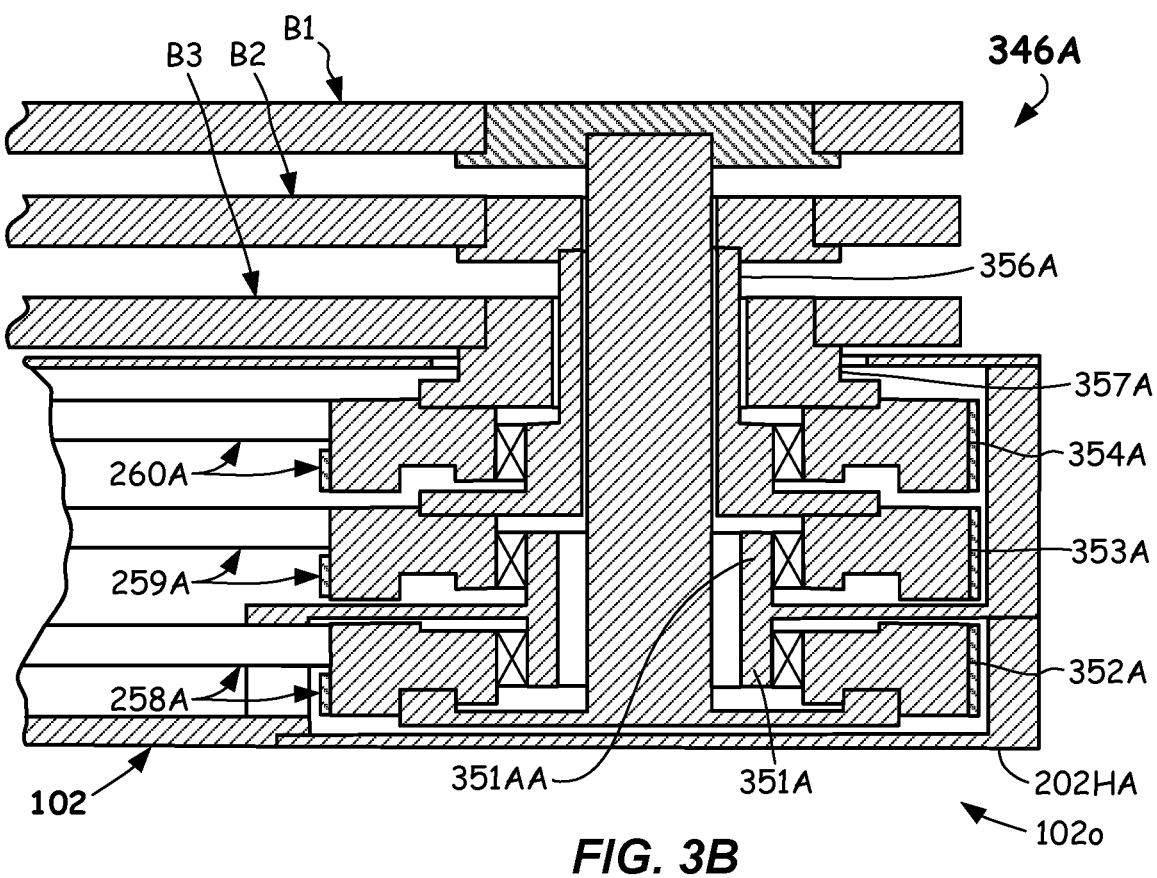
FIG. 3B illustrates a partial cross-sectional side view of an outboard end of an alternative drive assembly of a robot apparatus according to one or more embodiments.

Now referring to FIGS. 2B and 3B, another embodiment of a blade drive assembly including the inboard end drive assembly 245A and an outboard end drive assembly 346A are shown and described. The inboard end drive assembly 245A includes a first inboard pilot 247A that can extend downwardly as shown from a central portion of an upper arm housing 202HA, and a first driving pulley 248A mounted for rotation on the first pilot 247A, such as by a suitable bearing or the like. Inboard end drive assembly 245A further includes a second driving pulley 249A mounted for rotation on the first driving pulley 248A, such as by a suitable bearing or the like coupled between the second driving pulley 249A and a portion 248PA extending upwardly from the central portion of the upper arm housing 202HA. Inboard end drive assembly 245A further includes a third driving pulley 250A mounted for rotation on the second driving pulley 249A, such as by a suitable bearing or the like coupled between the third driving pulley 250A and a portion 249PA of the second driving pulley 249A. Connections between the respective shafts 134-137 and the respective driving pulleys 248A, 249A, 250A can be by any suitable connection mechanism, such as bolts, screws, a clamping mechanism, and the like.

Referring now to FIG. 3B, the outboard end 102o of the blade drive assembly includes outboard end drive assembly 346A. The outboard end drive assembly 346A includes a first outboard pilot 351A that may extend downwardly, as shown, from a central portion of the upper arm housing 202HA, and a first driven pulley 352A mounted for rotation on the first outboard pilot 351A, such as by a suitable bearing or the like. Outboard end drive assembly 346A can further include a second driven pulley 353A mounted for rotation on a second pilot 351AA extending upwardly from a central portion of the upper arm housing 202HA, such as by bearings or the like. Outboard end drive assembly 346A can further include a third driven pulley 354A mounted for rotation on the second driven pulley 353A. The mounting for rotation can be by rotationally mounting the third driven pulley 354A to a second shaft 356A connected to a second blade B2 and the second driven pulley 353A. Bolts, screws or other fasteners (not shown) may be used to make the various connections between the first shaft 355A and the first driven pulley 352A, and the first shaft and the first blade B1. Likewise, bolts, screws or other fasteners (not shown) may be used to connect the second shaft 355A to the second blade B2 and to the second driven pulley 353A, and the used to connect the third shaft 357A to the first blade B1 and to the third driven pulley 354A.

In each embodiment above, a transmission member can connect between the respective driving pulleys and driven pulleys of the respective blade drive assemblies. For example, in the embodiment of FIGS. 2A and 3A, a first transmission member 258 can interconnect the first driving pulley 248 and the first driven pulley 352. A second transmission member 259 may interconnect the second driving pulley 249 and the second driven pulley 353. A third transmission member 260 may interconnect the third driving pulley 250 and the third driven pulley 354.

Likewise, in the embodiment of FIGS. 2B and 3B, a first transmission member 258A may interconnect the first driving pulley 248A and the first driven pulley 352A. A second transmission member 259A may interconnect the second driving pulley 249A and the second driven pulley 353A. A third transmission member 260A may interconnect the third driving pulley 250A and the third driven pulley 354A.

The first, second, and third transmission members 258, 258A, 259, 259A, 260, and 260A may comprise one or more belts or straps, such as two oppositely-wound discontinuous metal straps, wherein each strap is rigidly coupled (e.g., pinned) to the corresponding driving pulley 248, 248A, 249, 249A, 250 and 259A and driven pulley 342, 342A, 353, 353A, 354, 354A at the ends thereof.

The robot apparatus 100 is adapted to pick or place substrates 115 (sometimes referred to as "wafers" or "semiconductor wafers") to or from a destination in an electronic device manufacturing system 400, as is shown in FIG. 4. However, any type of electronic device substrate, mask, or other silica-containing substrate may be conveyed and transferred by the robot apparatus 100. The destination may be one or more chambers coupled to the transfer chamber 413. For example, the destination may be one or more process chambers 403 and/or one or more of the load lock apparatus 409A, 409B that may be distributed about and coupled to the transfer chamber 413. As shown, transfers may be through slit valves 411, for example.

The electronic device processing system 400 can include a mainframe 401 including the transfer chamber 413 and at least two process chambers 403. A housing of the mainframe 401 includes the transfer chamber 413 therein. The transfer chamber 413 can include top wall (not shown), bottom wall (floor) 439, and side walls, and, in some embodiments, may be maintained in a vacuum, for example. In the depicted embodiment, the robot apparatus 100 is mounted to the bottom wall (floor) 439. However, it could be mounted elsewhere, such as to the top wall (not shown—removed for clarity).

Process chambers 403 may be adapted to carry out any number of processes on the substrates 115. The processes can include deposition, oxidation, nitration, etching, polishing, cleaning, lithography, metrology, or the like. Other processes may be carried out, as well. The load lock apparatus 409A, 409B may be adapted to interface with a factory interface 417 or other system component, that may receive substrates 115 from substrate carriers 419 (e.g., Front Opening Unified Pods (FOUPs)) that can be docked at load ports of the factory interface 417, for example. A load/unload robot 421 (shown dotted) may be used to transfer substrates 115 between the substrate carriers 419 and the load lock apparatus 409A, 409B. Transfers of substrates 115 may be carried out in any sequence or direction. Load/unload robot 421 may be identical to robot apparatus 100 in some embodiments, but may include a mechanism to allow the robot apparatus to move laterally in either lateral direction and indicated by arrow 423. Any other suitable robot can be used.

Figure 5A:
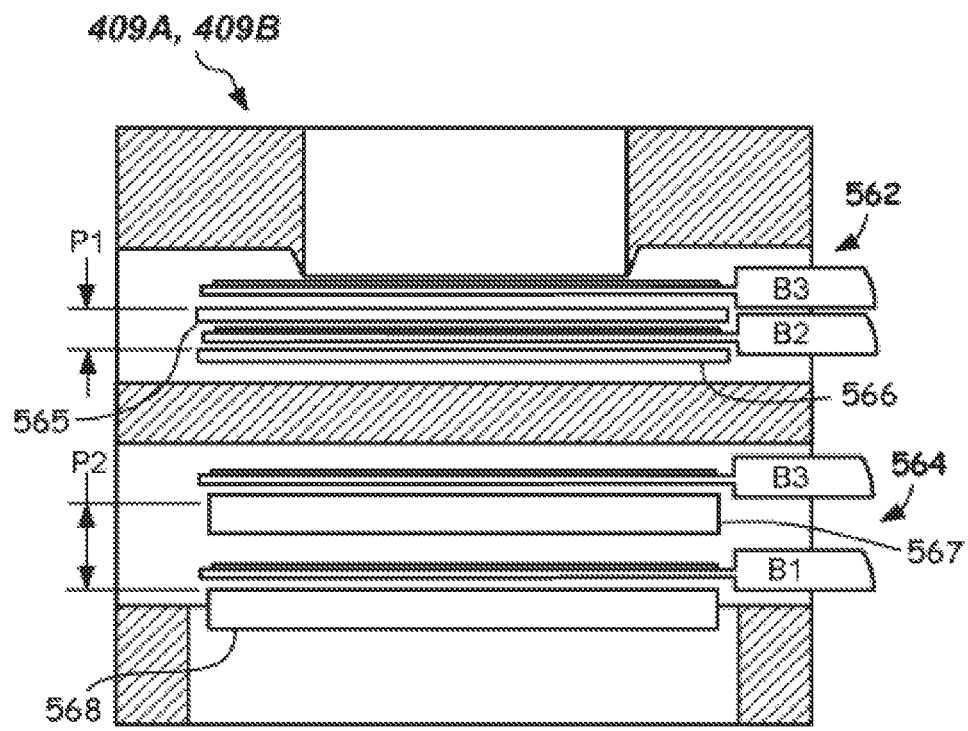
FIG. 5A is a partial cross-sectional side view of a load lock apparatus including multiple dual load lock apparatus with different vertical pitches between respective upper and lower substrate supports according to one or more embodiments.
Figure 5B:
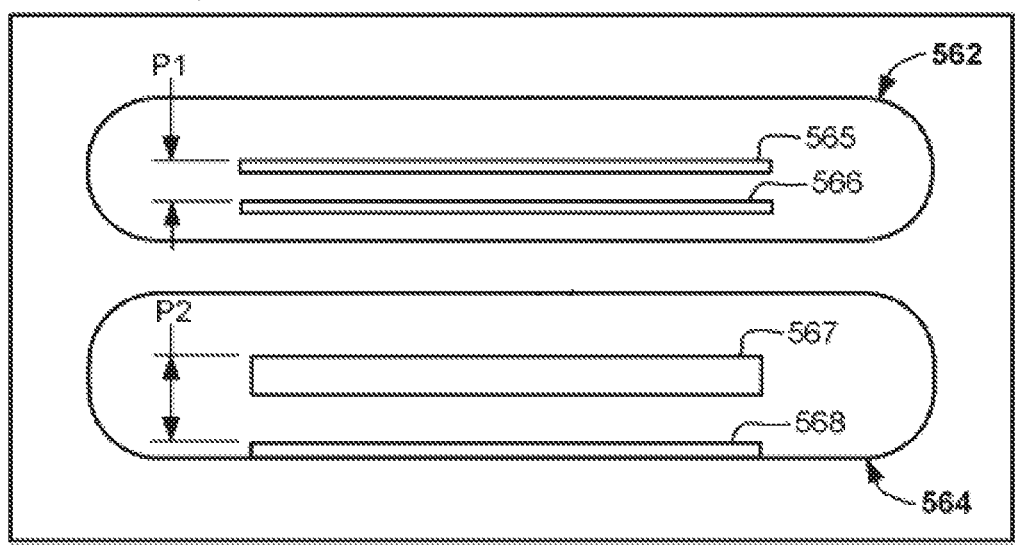
FIG. 5B is a front view of a load lock apparatus of FIG. 5A according to one or more embodiments.

Referring now to FIGS. 5A and 5B, transfer of substrates 115 through the load lock apparatus 409A, 409B and to and from the transfer chamber 413 (FIG. 4) is described. Load lock apparatus 409A, 409B may be identical in some embodiments. In the depicted embodiment, at least one of the load lock apparatus 409A, 409B, and preferably both, include a first dual load lock 562 that is coupled or interconnected between the factory interface 417 and the mainframe 401 (FIG. 4). First dual load lock 562 includes a first vertical pitch P1 between an upper support surface of an upper load lock support 565 and an upper support surface of a lower load lock support 566 of the first dual load lock 562. Upper load lock support 565 and lower load lock support 566 can be disc-shaped pedestals, for example. At least one of the load lock apparatus 409A, 409B, and preferably both, include second dual load lock 564 that can be coupled to or interconnected between the factory interface 417 and the mainframe 401 (FIG. 4) and can includes a second vertical pitch P2 between an upper support surface of an upper load lock support 567 and an upper support surface of a lower load lock support 568 of the second dual load lock 564. Upper load lock support 567 and lower load lock support 568 can be disc-shaped pedestals, for example. In the depicted embodiment, the first vertical pitch P1 is less than the second vertical pitch P2 (i.e., P1<P2). In some embodiments, the second vertical pitch P2 is approximately twice (2×) the first vertical pitch P1 (i.e., P2=2×P2). Furthermore, the vertical spacing V between the blades B2 and B3 can be equal to P1 and the spacing between blades B1 and B3 can be equal to 2×V. By way of example, Pitch P1 may be between about 7 mm and about 25 mm, or even about 10 mm and about 20 mm, for example.

As shown, the first dual load lock 562 is positioned above the second dual load lock 564. However, it should be understood that the first dual load lock 562 and the second dual load lock 564 may be positioned alongside one another, i.e., in a side-by-side orientation wherein the first dual load lock 562 of pitch P1 can be provided in load lock apparatus 409A and the second dual load lock 564 of pitch P2 can be provided in load lock apparatus 409B, or vice versa. In another embodiment, the two first dual load locks 562 of pitch P1 can be provided in load lock apparatus 409A and two second dual load locks 564 of pitch P2 can be provided in load lock apparatus 409B, or vice versa.

As shown, the first dual load lock 562 is configured to receive the second blade B2 and the third blade B3. The second dual load lock 564 of pitch P2 is configured to receive the first blade B1 and the third blade B3. Thus, in one aspect, a put and get sequence carried out by the robot apparatus 100 can be:

Get of two substrates 115 from lower load lock 564 by blades B1 and B3,
Get by blade B2 from a first process chamber 403,
Put of substrate 115 by blade B1 to same process chamber 403,
Get by B1 from another process chamber 403,
Put by B3 to the other process chamber 403, and
Put in upper dual load lock 562 by blades B2 and B1.

Other suitable sequences where blades B1 and B3 get from lower load lock 564 and put in upper load lock 562 are possible. For example, the following sequence could alternatively be employed:

Get of two substrates 115 from lower load lock 564 by blades B1 and B3,
Get by blade B2 from a first process chamber 403,
Put of substrate 115 by blade B3 to same process chamber 403,
Get by B3 from another process chamber 403,
Put by B1 to the other process chamber 403, and
Put in upper dual load lock 562 by blades B2 and B3.

The above two sequences may be effective reversed by starting with a get of two substrates 115 from upper load lock 564 with blades B2 and B3 (or blades B1 and B2) and ending with a put of two substrates 115 to the lower load lock 564 with blades B1 and B3.

Figure 6A:
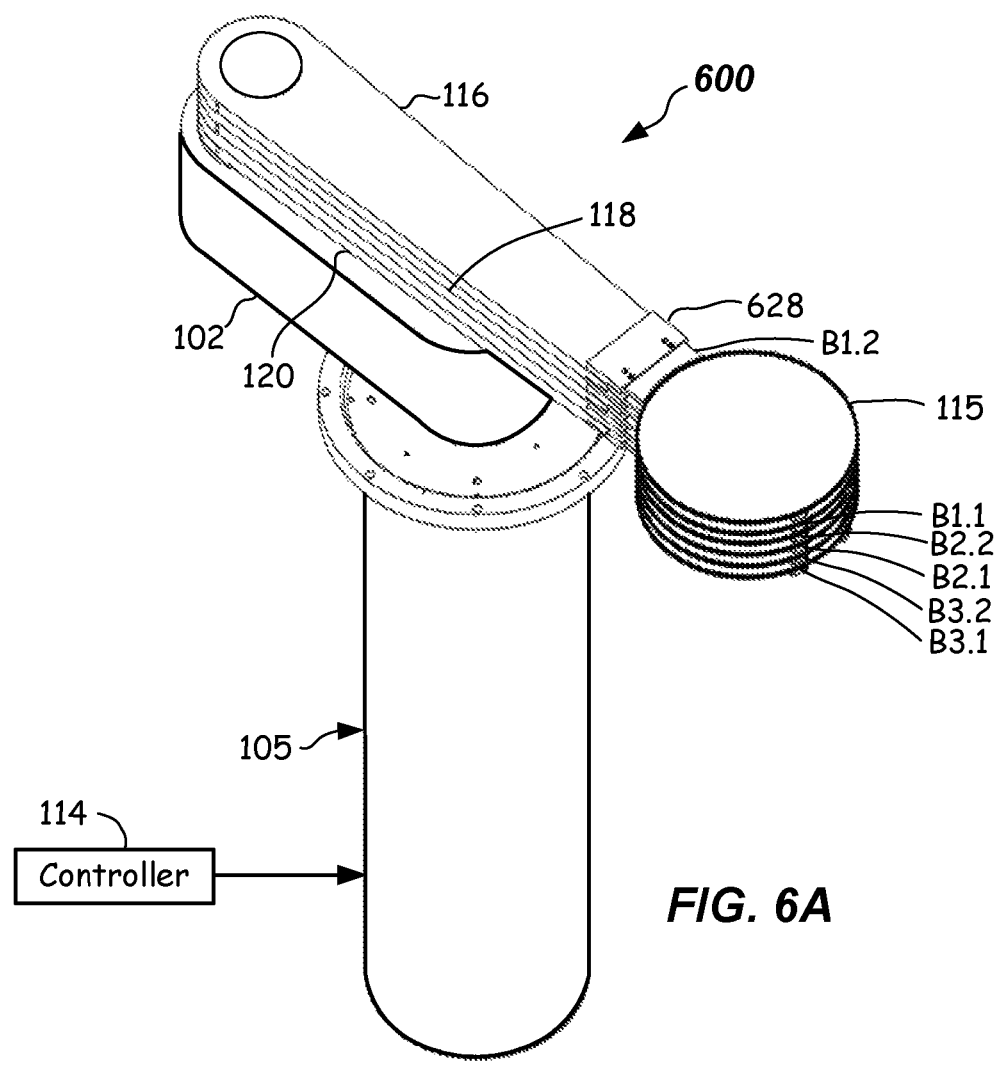
FIG. 6A illustrates a perspective view of an alternative robot apparatus including three independently-controllable wrists and six blades (two end effectors per wrist member) according to one or more embodiments.
Figure 6B:
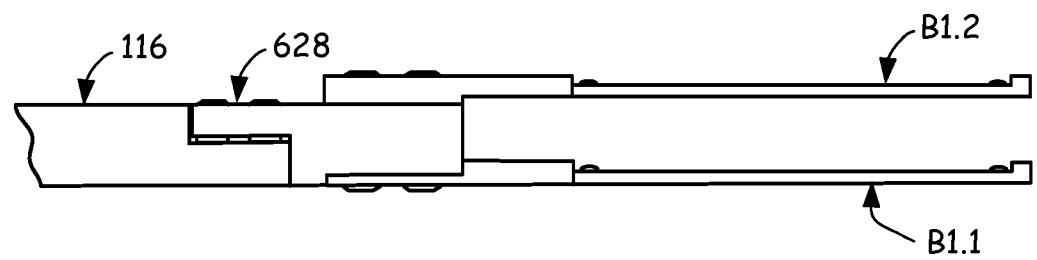
FIG. 6B illustrates a partial side view of a blade of the alternative robot apparatus of FIG. 6A showing the attachment features of the dual end effectors according to one or more embodiments.

In an additional embodiment, a robot apparatus 600 is provided wherein the first blade 116 includes dual end effectors B1.1 and B1.2 as shown in FIG. 6A. The other two wrist members also include two end effectors each. Thus, the end effectors B1.1 and B1.2 move in unison as do the other pairs of end effectors. FIGS. 6A and 6B illustrates an embodiment including six end effectors. Each of the pairs of end effectors are independently rotatable. As shown in FIG. 6B, the dual end effectors B1.1 and B1.2 are shown connected to the first wrist member 116 by orientation adjuster 628. The same construction is used for dual end effectors B2.1 and B2.2 attached to second wrist member 118, and the dual end effectors B3.1 and B3.2 attached to the third wrist member 120. The drive motor assembly 105 and the blade drive assembly can be the same as described before for FIG. 1A-3B. This embodiment enables even more Put and Get capability and thus enhanced efficiencies. As should be understood, in this embodiment, load lock apparatus will include twice as many substrate support locations per load lock. One suitable Put and Get sequence that can be carried out by robot apparatus 600 is, for example:

Dual GET from a load lock by B1.1, B1.2 & B2.1, B2.2 (4 substrates 115 picked up),
B3.1 and B3.2 carry no substrates initially,
Process chamber 403 GET by B3.2,
Process chamber 403 PUT by B2.1,
Process chamber 403 GET by B3.1,
Process chamber 403 PUT by B2.2,
Process chamber 403 GET by B2.2,
Process chamber 403 PUT by B1.1,
Process chamber 403 GET by B2.1,
Process chamber 403 PUT by B1.2, and
Dual PUT in the load lock (or another load lock) by B2.1, B2.2 & B3.1, B3.2 (4 substrates 115).

Another possible sequence that can be carried out by the robot apparatus 600 is:

Dual GET from a first load lock by B2.1, B2.2 & B3.1, B3.2 (4 substrates 115 picked up),
B1.1 and B1.2 carry no substrates initially,
Process chamber 403 GET by B1.2,
Process chamber 403 PUT by B2.1,
Process chamber 403 GET by B1.1,
Process chamber 403 PUT by B2.2,
Process chamber 403 GET by B1.2,
Process chamber 403 PUT by B3.1,
Process chamber 403 GET by B2.1,
Process chamber 403 PUT by B3.2, and
Dual PUT in the first load lock (or another load lock) by B1.1, B1.2 & B2.1, B2.2 (4 substrates 115).

Figure 7:
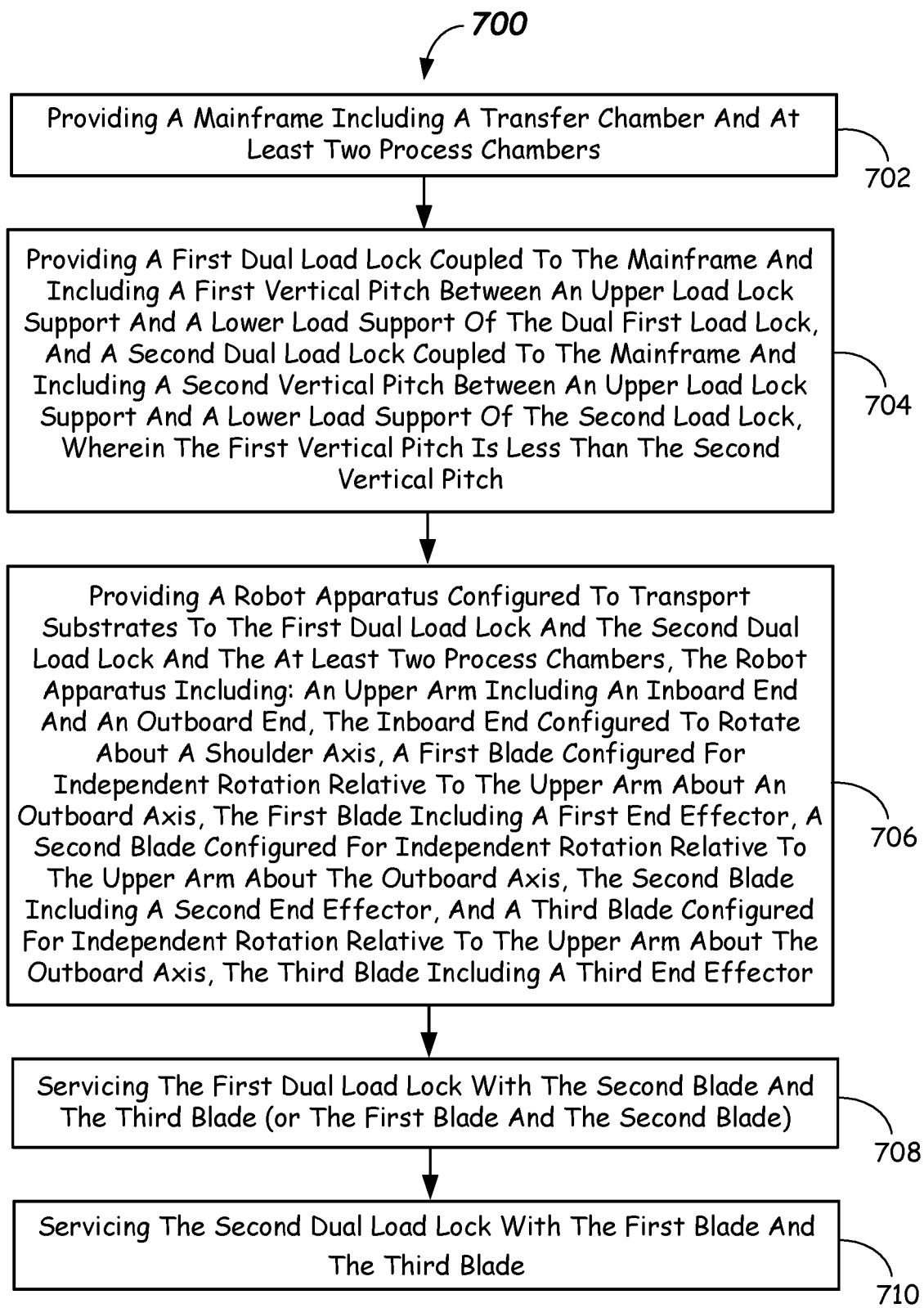
FIG. 7 is a flowchart depicting a method of transporting multiple substrates within an electronic device manufacturing apparatus according to one or more embodiments.

With reference to FIG. 7, a method 700 of transporting substrates within an electronic device manufacturing apparatus (e.g., electronic process device manufacturing apparatus 400) is provided. The method 700 includes, in 702, providing a mainframe (e.g., mainframe 401) including a transfer chamber (e.g., transfer chamber 413) and at least two process chambers (e.g., process chambers 403). The method 700 further includes providing a first dual load lock (e.g., first dual load lock 562) coupled to the mainframe and including a first vertical pitch (e.g., P1) between an upper load lock support (e.g., upper load lock support 565) and a lower load lock support (e.g., lower load lock support 566) of the dual first load lock, and a second dual load lock (e.g., second dual load lock 564) coupled to the mainframe and including a second vertical pitch (e.g., P2) between an upper load lock support (e.g., upper load lock support 567) and a lower load lock support (e.g., second load lock support 568) of the second dual load lock, wherein the first vertical pitch is less than the second vertical pitch (e.g., P1<P2). In some embodiments P2=2×P1.

The method 700 further includes, in 706, providing a robot apparatus (e.g., robot apparatus 100) configured to transport substrates (substrates 115) to the first dual load lock and the second dual load lock and the at least two process chambers, the robot apparatus including: an upper arm (e.g., upper arm 102) including an inboard end (e.g., inboard end 102*i*) and an outboard end (e.g., outboard end 102*o*), the inboard end configured to rotate about a shoulder axis (e.g., shoulder axis 104), a first blade (e.g., first blade B1) configured for independent rotation relative to the upper arm about an outboard axis (e.g., outboard axis 107), the first blade including a first end effector (e.g., first end effector 122), a second blade (e.g., second blade B2) configured for independent rotation relative to the upper arm about the outboard axis, the second blade including a second end effector (e.g., second end effector 124), and a third blade (e.g., third blade B3) configured for independent rotation relative to the upper arm about the outboard axis, the third blade including a third end effector (e.g., third end effector 126).

The method 700 further includes, in 708, servicing the first dual load lock (e.g., first dual load lock 562) with the second blade B2 and the third blade B3 (or optionally with the with the first blade B1 and the second blade B2); and in 710, servicing the second dual load lock (e.g., second dual load lock 564) with the first blade B1 and the third blade B3.

In the case of the FIG. 6 embodiment with end effectors B1.1 through B3.2, a first load lock can be serviced with end effectors B2.1 and B2.2 and end effectors B3.1 and B3.2, or optionally end effectors B1.1 and B1.2 and end effectors B2.1 and B2.2.

The foregoing description discloses only certain example embodiments. Modifications of the above-disclosed systems, apparatus, and methods which fall within the scope of the disclosure will be readily apparent to those of ordinary skill in the art. Accordingly, while the present disclosure has been disclosed in connection with certain example embodiments, it should be understood that other embodiments may fall within the scope of the invention, as defined by the following claims.

The invention claimed is:

1. A robot apparatus, comprising:
    a drive motor assembly;
    an upper arm configured to rotate relative to the drive motor assembly, the upper arm including an inboard end and an outboard end, wherein the inboard end is configured to rotate about a shoulder axis;
    a first blade configured for independent rotation relative to the upper arm about an outboard axis, the first blade including a first end effector;
    a second blade configured for independent rotation relative to the upper arm about the outboard axis, the second blade including a second end effector and;
    an inboard drive assembly coupled to the drive motor assembly, the inboard drive assembly comprising:
        a first inboard pilot;
        a first driving pulley mounted for rotation on the first inboard pilot and configured to facilitate the independent rotation of the first blade relative to the upper arm about the outboard axis; and
        a second driving pulley mounted for rotation on the first driving pulley and configured to facilitate the independent rotation of the second blade relative to the upper arm about the outboard axis.

2. The robot apparatus of claim 1, wherein the drive motor assembly includes:
    an upper arm drive motor configured to cause the independent rotation of the upper arm;
    a first drive motor configured to cause the independent rotation of the first blade; and
    a second drive motor configured to cause the independent rotation of the second blade.

3. The robot apparatus of claim 1, wherein the drive motor assembly includes an upper arm shaft, a first blade shaft, and a second blade shaft, wherein the upper arm shaft, the first blade shaft and the second blade shaft are co-axial.

4. The robot apparatus of claim 3, wherein the first driving pulley is coupled to the first blade shaft and the second driving pulley is coupled to the second blade shaft.

5. The robot apparatus of claim 1, wherein the first end effector and the second end effector lie one above another when configured in a folded and zeroed configuration.

6. The robot apparatus of claim 1, wherein a first length L1 from the shoulder axis to the outboard axis and a second length L2 between the outboard axis and a substrate support center of the each of the first end effector and second end effector is related by L2>L1.

7. The robot apparatus of claim 6 wherein L1≤L2≤2L1.

8. The robot apparatus of claim 6 wherein 1.5L1≤L2≤2L1.

9. The robot apparatus of claim 1, wherein the inboard drive assembly is configured at the inboard end of the upper arm, and wherein the inboard drive assembly further comprises:
    a second inboard pilot, wherein the second driving pulley is further mounted for rotation on the second inboard pilot.

10. The robot apparatus of claim 1, comprising an outboard drive assembly, having:
    a first outboard pilot;
    a first driven pulley mounted for rotation on the first outboard pilot; and
    a second driven pulley mounted for rotation on the first driven pulley.

11. The robot apparatus of claim 1, wherein the outboard end of the upper arm comprises:
    a first outboard pilot;
    a second outboard pilot;
    a first driven pulley mounted for rotation on the first outboard pilot; and
    a second driven pulley mounted for rotation on the second outboard pilot.

12. The robot apparatus of claim 1, wherein the first blade includes dual end effectors.

13. The robot apparatus of claim 1, further comprising:
    a third blade configured for independent rotation relative to the upper arm about the outboard axis, the third blade including a third end effector.

14. An electronic device manufacturing apparatus, comprising:
    a mainframe including a transfer chamber and at least two process chambers;
    a first dual load lock coupled to the mainframe and including a first vertical pitch between an upper load lock support and a lower load lock support;
    a second dual load lock coupled to the mainframe and including a second vertical pitch between an upper load lock support and a lower load lock support of the second dual load lock, wherein the first vertical pitch is less than the second vertical pitch; and
    a robot apparatus configured to transport substrates to the first dual load lock and the second dual load lock and the at least two process chambers, the robot apparatus including:
        an upper arm including an inboard end and an outboard end, the inboard end configured to rotate about a shoulder axis,
        a first blade configured for independent rotation relative to the upper arm about an outboard axis, the first blade including a first end effector,
        a second blade configured for independent rotation relative to the upper arm about the outboard axis, the second blade including a second end effector, and
        a third blade configured for independent rotation relative to the upper arm about the outboard axis, the third blade including a third end effector,
        wherein a vertical spacing between the first end effector and the second end effector equals the first vertical pitch and a spacing between the first end effector and the third end effector is equal to the second vertical pitch.

15. The electronic device manufacturing apparatus of claim 14, wherein the second vertical pitch is approximately twice the first vertical pitch.

16. The electronic device manufacturing apparatus of claim 14, wherein the first dual load lock is positioned above the second dual load lock.

17. The electronic device manufacturing apparatus of claim 14, wherein the second dual load lock is configured to receive the first blade and the third blade.

18. The electronic device manufacturing apparatus of claim 14, wherein the first dual load lock is configured to receive the first blade and the second blade or the second blade and the third blade.

19. The electronic device manufacturing apparatus of claim 14, wherein the first blade and third blade are spaced to put and get substrates to and from the upper load lock support and the lower load lock support of the second dual load lock.

20. The electronic device manufacturing apparatus of claim 14, wherein the second blade and the third blade and the first blade and the second blade are spaced to put and get substrates to and from an upper load lock support and a lower load lock support of the first dual load lock.

21. A robot apparatus, comprising:
  a drive motor assembly;
  an upper arm configured to rotate relative to the drive motor assembly, the upper arm including an inboard end and an outboard end, wherein the inboard end is configured to rotate about a shoulder axis;
  a first blade configured for independent rotation relative to the upper arm about an outboard axis, the first blade including a first end effector;
  a second blade configured for independent rotation relative to the upper arm about the outboard axis, the second blade including a second end effector; and
  an outboard drive assembly coupled to the drive motor assembly, the outboard drive assembly comprising:
    a first outboard pilot;
    a first driven pulley mounted for rotation on the first outboard pilot and configured to facilitate the independent rotation of the first blade relative to the upper arm about the outboard axis; and
    a second driven pulley mounted for rotation on the first driven pulley and configured to facilitate the independent rotation of the second blade relative to the upper arm about the outboard axis.

* * * * *